United States Patent [19]
Dietze

[11] Patent Number: 6,013,319
[45] Date of Patent: Jan. 11, 2000

[54] METHOD AND APPARATUS FOR INCREASING DEPOSITION QUALITY OF A CHEMICAL VAPOR DEPOSITION SYSTEM

[76] Inventor: Gerald R. Dietze, 707 SE. 70th Ave., Portland, Oreg. 97215

[21] Appl. No.: 09/069,220

[22] Filed: Apr. 28, 1998

[51] Int. Cl.[7] .................................................. C23C 16/00
[52] U.S. Cl. ..................... 427/255.28; 117/102; 118/715; 118/728; 118/730; 427/255.5
[58] Field of Search ................................... 118/715, 728, 118/730; 427/255.28, 255.5; 117/102

[56] References Cited

U.S. PATENT DOCUMENTS

| | | | |
|---|---|---|---|
| 5,096,534 | 3/1992 | Ozias | 117/102 |
| 5,244,694 | 9/1993 | Ozias | 427/248.1 |
| 5,411,590 | 5/1995 | Hawkins et al. | 118/715 |
| 5,518,549 | 5/1996 | Hellwig | 118/728 |
| 5,525,157 | 6/1996 | Hawkins et al. | 118/715 |
| 5,565,382 | 10/1996 | Tseng et al. | 118/715 X |

*Primary Examiner*—Leo B. Tentoni
*Attorney, Agent, or Firm*—Douglas G. Anderson; Timothy H. Courson

[57] ABSTRACT

A method is introduced which improves gas flow characteristics within a reaction chamber used in a Chemical Vapor Deposition (CVD) system, thereby reducing the formation of Light Point Defects (LPDs) and improving epitaxial layer thickness control. This is accomplished by forcing the gas flow from its normally turbulent or non-uniform state into a more steady, linear, and controlled flow using one or more baffles. A steady flow of reactant gases significantly reduces the tendency of particles to move from a lower portion of the reaction chamber and settle onto the wafer during processing, thus reducing LPDs. It further allows a more controlled deposition onto the wafer which in effect improves the layer thickness control. A chemical vapor deposition system is also provided for deposition of silicon from a gas flow onto a substrate which has a reaction chamber with a non-uniform cross-sectional area and one or more baffles placed within the reaction chamber for transforming the non-uniform cross-sectional area into a substantially uniform cross-sectional area. The baffle(s) are placed within the reaction chamber such that their inner surfaces control the gas flow and substantially prevent gas flow turbulence thereby improving uniformity of deposition and reducing or preventing LPDs. Baffles are disclosed which serve the above-mentioned purposes.

9 Claims, 5 Drawing Sheets

METHOD AND APPARATUS FOR INCREASING DEPOSITION QUALITY OF A CHEMICAL VAPOR DEPOSITION SYSTEM

BACKGROUND OF THE INVENTION

This invention relates generally to Chemical Vapor Deposition (CVD) Systems. More specifically, this invention relates to a method and apparatus for reducing gas flow turbulence within an epitaxial CVD reaction chamber of a CVD system, thereby improving deposition quality onto a substrate.

CVD is the formation of a solid compound on a heated substrate by thermal reaction and/or decomposition of gaseous compounds. Epitaxial deposition is a specific type of CVD where a crystallographic orientation of the substrate is replicated in the growing film. Prior art CVD systems incorporate many variations in the number and type of components used for implementation of the deposition process, but they generally include a reaction chamber which contains the wafer or substrate, a gas control system, an electronic control system, a heat source, and a waste treatment system for disposing of exhaust gases.

The key to an efficient reaction chamber is to provide a controlled environment that allows for a safe and stable deposition of compounds. The chamber may be of any suitable material, but quartz is typically employed because its inert properties prevent chemical reactions between it and the deposition gases. Epitaxial deposition reactors can be classified into three general designs, namely, horizontal, vertical, and cylindrical systems. In horizontal systems, wafers are placed horizontally on boats or susceptors. Horizontal systems are configured to allow the gas to flow into the reaction chamber from one end, across the wafers, and out of the reaction chamber at an opposite end. Vertical systems have the wafers placed horizontally on a susceptor mounted rotatably within the chamber, and the gas flows vertically downward from the top of the reaction chamber towards the wafers to ensure a uniform temperature and gas distribution. Cylindrical or barrel reactors have the wafers removably mounted onto the outer surface of a rotatable cylindrical susceptor. The gases in a cylindrical system flow vertically downward into the reaction chamber from the top, passing over the wafers, and then exit the reaction chamber through an exhaust at the bottom.

A heating process of a cold wall CVD reactor is needed to facilitate the desired chemical reaction between the gas and the wafer or substrate. The heating process is accomplished by means of radio frequency (RF) energy, radiation energy in the ultraviolet (UV), visible, or infrared (IR) bands, or resistance heating. Susceptors heated by the RF method are typically made of silicon carbide coated carbon and employ energy coupling through an RF coil to channel the energy of the RF coil into the susceptor. Heating of the wafers is achieved by contact with the susceptor. UV or IR heating is achieved using high intensity lamps that emit light energy in the ultraviolet, visible, and/or infrared spectrum. The radiation energy emitted from such lamps heats the wafer and the susceptor. In cold wall reactors, the walls of the chambers are kept cool compared to the wafer to prevent leakage of radiation into the exterior of the system.

Prior to the heating process, any residual air remaining within the reaction chamber needs to be removed or purged. Similarly, any process gases remaining in the chamber after the processing and cool-down processes must be flushed out. Purge gases typically comprise non-reactive gases such as nitrogen and are used at the beginning and the end of each deposition cycle. Purging is done prior to opening the chamber after a complete deposition process in order to assure that no reactive component gases are left within the reaction chamber.

The deposition process itself involves the transportation of reaction gases containing the necessary chemical components across the wafer such that a film can be grown onto the wafer. The deposition process also simultaneously provides for the doping of the growing film. Process gases can include gaseous components that deposit, dope, and etch depending on the desired process flow. All such gaseous components are transported through the reaction chamber by means of a carrier gas which is typically hydrogen or helium. The carrier gas is used before, during and after the deposition cycle. Etching gases, such as anhydrous hydrogen chloride (HCl) may be used before the actual deposition cycle to remove a thin layer of silicon, thereby creating a hydrophobic surface and removing any foreign matter or crystallographic defects prior to the film deposition. Once the process is initiated, the chamber flushed, and the right temperature achieved, the process gases are added to the carrier gas. Conventional source gases for silicon deposition are Silane ($SiH_4$), Dichlorosilane ($SiH_2Cl_2$), Trichlorosilane ($SiHCl_3$) or Silicon Tetrachloride ($SiCl_4$). Dopant gases added to the gas components during film growth normally comprise Arsine ($AsH_3$), Phosphine ($PH_3$) or Diborane ($B_2H_6$).

Unfortunately, most prior art systems for CVD inherently produce a non-uniform deposition on the wafer surface, partially due to the presence of particles, contaminants, wall deposits, and other defects within the reaction chamber. All of these defects can cause particle generation, inhomogeneous gas flow over the wafer, and low productivity. Non-uniform depositions can also be caused by uncontrolled gas velocity or density profiles. The industry has traditionally been unable to maintain quality in conventional CVD systems for depositing silicon onto a substrate because conventional reaction chambers used in these systems have a non-uniform cross-sectional area through which the deposition process gases flow. Gas flow turbulence results as those gases encounter variations in cross-sectional area and in the surface features of the chamber walls. Furthermore, Light Point Defects (LPDs) result as settled particles are disturbed from the floor of the reaction chamber by the gas flow turbulence and then find their way to the substrate surface. In addition to turbulence, non-uniformity of cross-sectional area in the reaction chamber results in variations in the velocity of the gas flow through the reaction chamber which also adversely affects the quality of the deposition.

These problems have become even more significant with the advent of single wafer processing systems, especially for large diameter wafers for future device processes. Compared with batch type systems, continuous flow single wafer systems require a rapid deposition rate to minimize process time, reduce gas usage, and maximize productivity. A high through-put with minimal gas usage, minimized particle generation, and uniform deposition rates over the wafer surface are the primary objects of efficient single wafer epitaxial CVD processing. However, all of these requirements are highly challenging to achieve.

Figure 1:
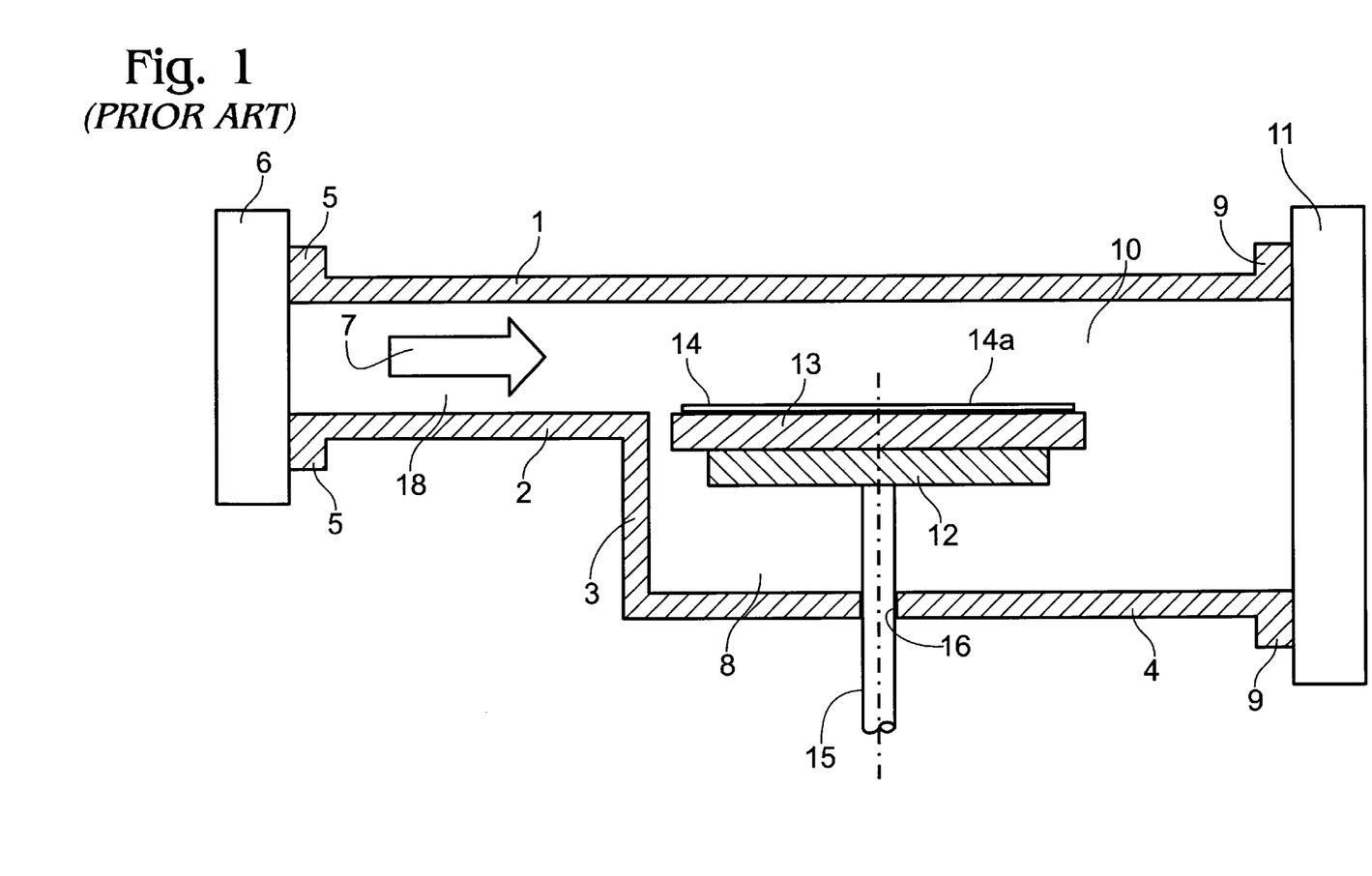
FIG. 1 is a right sectional view of an epitaxial reaction chamber of the prior art showing the direction of gas flow.

To more clearly understand the process and apparatus for single wafer epitaxial CVD deposition, the following explanation of the prior art is provided with reference to FIG. 1. A typical single wafer epitaxial reaction chamber has a top panel 1, a bottom panel 2, a vertical wall section 3, a lower bottom panel 4, a gas inlet flange 5, a gas injector 6, a gas outlet flange 9, a gas outlet 11, a quartz susceptor support 12, a susceptor 13, a rotary shaft 15, and a shaft outlet 16. The gas enters a front portion 18 of the reaction chamber via the gas injector 6. A resulting gas flow and velocity are symbolized by the arrow 7. The gas flow 7 travels across the wafer 14 and proceeds into the rear portion 10 of the reaction chamber. The wafer 14 is removably positioned on the susceptor 13. The susceptor 13 is mounted onto a quartz susceptor support 12 connected to the rotary shaft 15. The quartz susceptor support 12, and hence the susceptor 13 and wafer 14, are typically rotated during film deposition by means of the rotary shaft 15. The rotary shaft 15 is fitted into a shaft outlet 16, such that the rotary shaft 15 can be moved vertically to raise or lower the susceptor 13 within the reaction chamber. It should be understood that variations in operational features can be employed, such as, placing three evenly spaced wafers on the susceptor 13, for example.

A general problem with the prior art is the fact that the lower portion 8 tends to collect particles along the lower bottom panel 4 that may migrate to the wafer surface 14a as a result of gas turbulence. Such turbulence is unavoidable when a gas flow encounters irregularities in the reaction chamber such as corners, protrusions, or a change in the cross-sectional area.

Figure 2A:
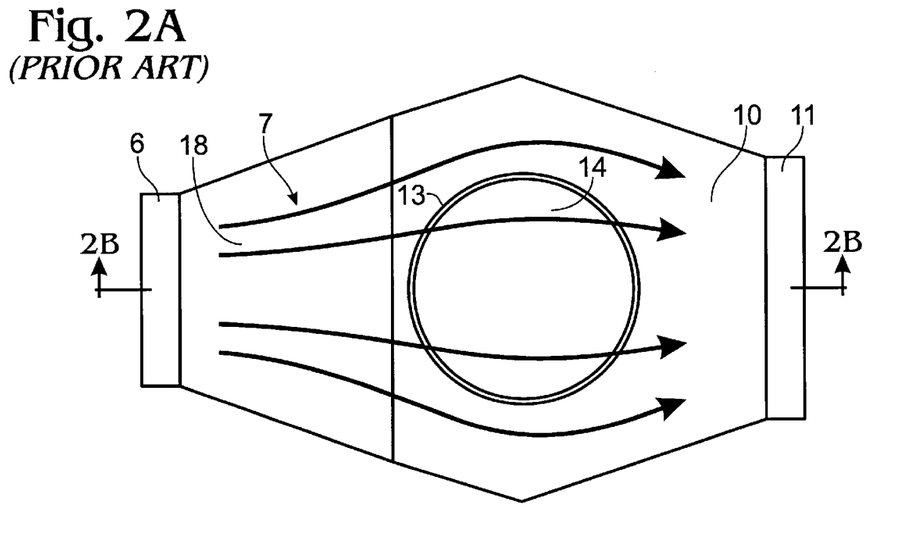
FIG. 2A is a top plan view of the conventional epitaxial reaction chamber as shown in FIG. 1, having the top panel removed to show internal components and further schematically showing the direction of gas flow.
Figure 2B:
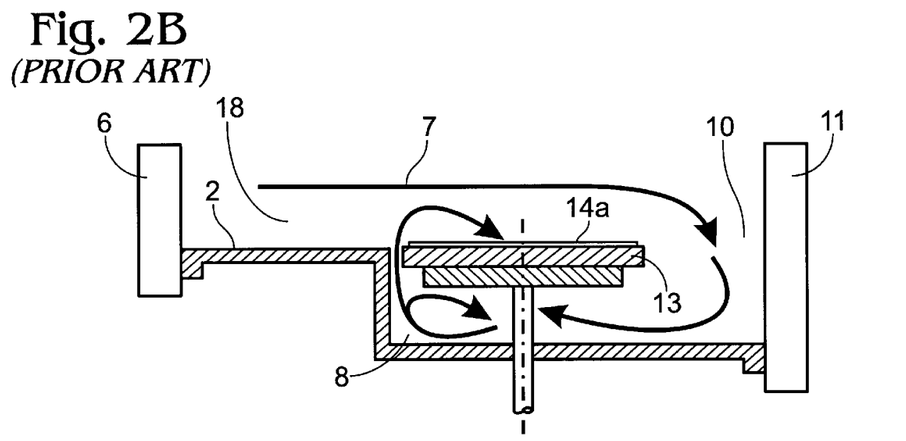
FIG. 2B is a sectional view of the conventional epitaxial reaction chamber of FIG. 1 taken along line 2B—2B in FIG. 2A having the top panel removed and further schematically showing gas turbulence within the reaction chamber.

As can be seen in FIGS. 1, 2A and 2B, the typical single wafer epitaxial reaction chamber has several such irregularities which will disturb a homogenous gas flow.

Figure 2C:
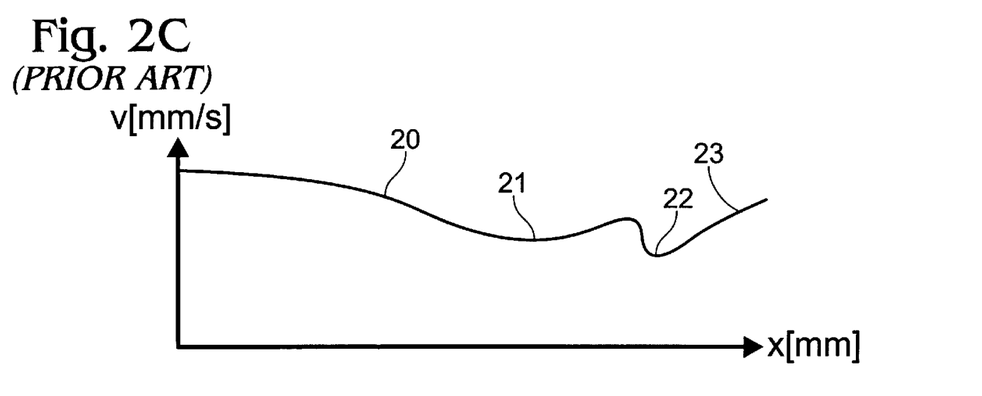
FIG. 2C is a Velocity vs. Distance graph showing variations in the velocity v of the gas flow within the epitaxial reaction chamber of FIG. 1 as the gas moves from the gas injector to the gas outlet.

Referring to FIGS. 1 and 2B, the gas flow 7 passes over the bottom panel 2 and the wafer 14 before entering the rear portion 10 of the reaction chamber where it encounters an increase in cross-sectional area at the interface between the susceptor 13 and the rear portion 10. FIG. 2A shows a top view of said single wafer epitaxial reaction chamber with the top panel 1 removed. The width of the reaction chamber begins to radially expand at the point of gas entry from the gas injector 6 to approximately the center of the susceptor 13. The width then radially decreases in the rear portion 10, from about the center of the susceptor 13 to the gas outlet 11. As is inherent in such designs, both the horizontal and the vertical changes in cross-sectional area create gas flow irregularities. FIG. 2C illustrates the variations in the gas flow velocity v (mm/s) over the distance x (mm) of the reaction chamber.

The gas flow velocity v decreases 20 as the cross-sectional area increases, but slightly increases 21 where the chamber begins to narrow. However, the gas flow velocity v abruptly drops 22 at the end of the susceptor 13 due to the sudden increase in cross-sectional area, and finally increases again 23 due to the narrowing of the cross-sectional area of the rear portion 10. These gas flow disturbances cause turbulence within the reaction chamber which detrimentally affects epitaxial layer thickness control and increases the LPD density caused by undesired particles reaching the wafer surface 14 a during deposition.

U.S. Pat. Nos. 5,096,534; 5,244,694; 5,525,157; and 5,411,590 disclose single wafer reaction chamber designs. Each of these patents describes reaction chambers having rectangular cross-sectional areas with improved gas flow control. These patents also teach that such a chamber design helps to achieve a more uniform deposition on the wafer surface, to minimize the presence of particles and contaminants within the reaction chamber, to reduce wall deposits on the interior of the reaction chamber which can cause particle generation, to achieve homogenous gas flow over the wafer to be processed, and to realize higher productivity by controlling gas velocity and density profiles. None of these patents, however, deals with or suggests how to retrofit existing reaction chambers having non-uniform cross-sectional areas in order to provide these same desirable attributes. Replacing the entire reaction chamber can be tedious and difficult, and is more expensive and time consuming than retrofitting an existing reaction chamber.

What is needed, therefore, is a means for configuring an existing reaction chamber, having a non-uniform cross-sectional area, such that gas turbulence and velocity variations are reduced or minimized.

SUMMARY OF THE INVENTION

According to the needs of the industry, one object of the present invention is to enable a substantially uniform gas flow across a wafer or substrate in a CVD process by reducing turbulence and gas flow variations within a reaction chamber.

Another object of the present invention is to reduce or eliminate LPDs caused by the disturbance of particles from a bottom panel of a reaction chamber.

Another object of the present invention is to improve the uniformity of deposition along a wafer or substrate within a CVD process or system which in turn improves the thickness variation over the entire wafer surface.

Yet another object of the present invention is to minimize or eliminate detrimental flow disturbances experienced in a conventional reaction chamber by significantly reducing structural irregularities within the conventional reaction chamber.

It is a further object of the present invention to enable the conversion of a less-efficient CVD reaction chamber into a more-efficient CVD reaction chamber by providing a method for simulating the characteristics of a reaction chamber having a uniform cross-sectional area within a reaction chamber having a non-uniform cross-sectional area, thereby allowing optimal operation without reaction chamber replacement.

Another object of this invention is to enable a reduction in the cross-sectional area of a reaction chamber having either a uniform or non-uniform cross-sectional area in order to reduce the amount of gas required to perform a CVD process.

According to the aforementioned objects, the present invention provides a retrofitting device and method for improving performance characteristics of reaction chambers used in CVD systems having non-uniform or oversized cross-sectional areas. This invention is particularly well-suited for reaction chambers used in epitaxial deposition systems for single chamber-wafer processing. This invention will allow a more efficient deposition onto a substrate or wafer and reduce particle deposits on a surface of the substrate or wafer.

A CVD system according to the present invention has a reaction chamber in which a deposition process is conducted. One or more baffles are placed within the reaction chamber to reduce variations in the cross-sectional area of the reaction chamber, thereby producing a substantially uniform gas flow velocity and direction. The baffles therefore reduce gas flow turbulence and correspondingly reduce epitaxial layer thickness variations during processing resulting in better flatness and layer thickness control. The invention also reduces or eliminates LPD formations, generated by disturbed particles reaching the wafer surface during epitaxial deposition. The overall impact of the invention is a significant yield increase over conventional CVD systems. Similar baffles may also be used in an oversized reaction chamber having a uniform cross-sectional area to reduce the cross-sectional area and thereby reduce the amount of process gases required to perform the deposition process.

The foregoing and other objects, features and advantages of the invention will become more readily apparent from the following detailed description of a preferred embodiment of the invention which proceeds with reference to the accompanying drawings.

DETAILED DESCRIPTION

A first preferred embodiment of the invention will now be described A with reference to FIGS. 3A, 3B, and 5A, 5B and 5C. A baffle 30, preferably made of quartz, is inserted into the rear portion 10 of the reaction chamber such that a base 30b thereof rests on the bottom panel 4. A baffle support 30d supports the baffle top 30e. The baffle top 30e has a substantially planar top surface 30a that is even with a top surface 13a of the susceptor 13. A recess 30c located in the baffle top 30e is shaped to receive a back portion 13b of the susceptor 13. The CVD process according to the invention is similar to that of the prior art. Accordingly, the gas flow 7 enters the reaction chamber through the gas injector 6 where it passes over the bottom panel 2 and the wafer 14 before entering the rear portion 10. However, unlike the prior art, when the baffle 30 is placed appropriately within the rear portion 10 of the reaction chamber, the gas flow 7 will not encounter a dramatic increase in cross-sectional area (see FIGS. 1 and 2B). Because the top surface 30a of the baffle 30 is at the same level as the top surface of the susceptor and substantially surrounds the back portion 13b of the susceptor 13, gas flow is prevented from dropping below the plane of the susceptor 13, thus providing a more steady and uniform gas flow through the reaction chamber. According to this invention, therefore, it is anticipated that gas flow disturbances, as they occur in the prior art, will be dramatically reduced.

Figure 3A:
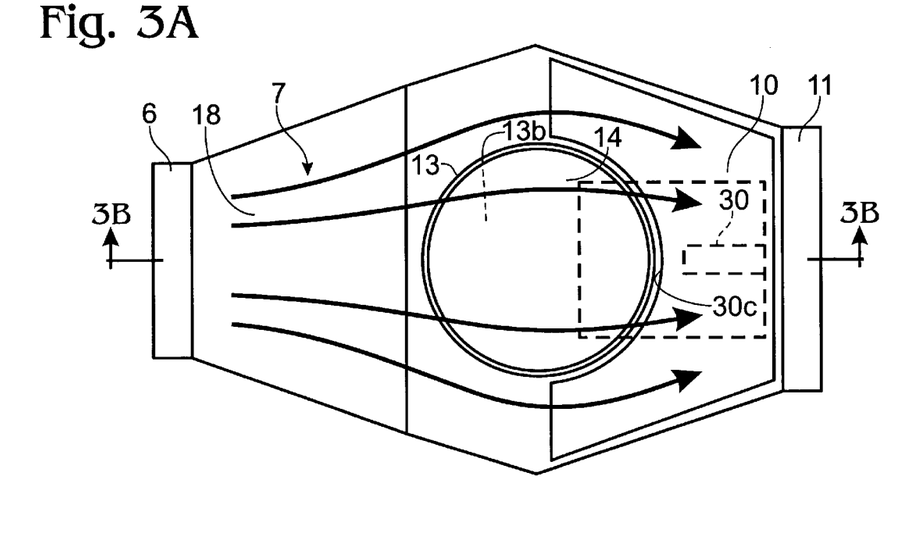
FIG. 3A is a top plan view of the conventional epitaxial reaction chamber shown in FIG. 1, with the top panel removed (similar to FIG. 2A) but incorporating a baffle according to a first preferred embodiment of the present invention and also schematically showing the direction of gas flow.
Figure 3B:
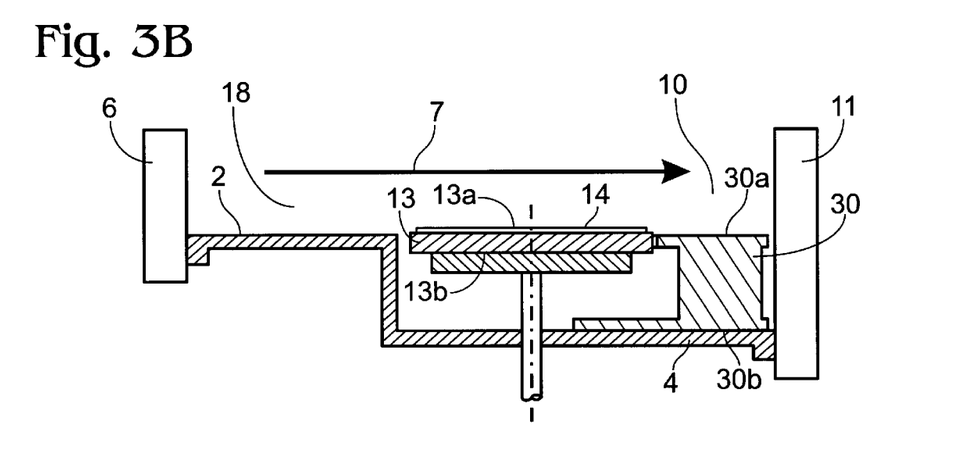
FIG. 3B is a sectional view of the epitaxial reaction chamber and quartz baffle according to the first embodiment, taken along line 3B—3B in FIG. 3A, with schematic illustration of the gas flow to show how the use of the baffle results in a more uniform gas flow.
Figure 3C:
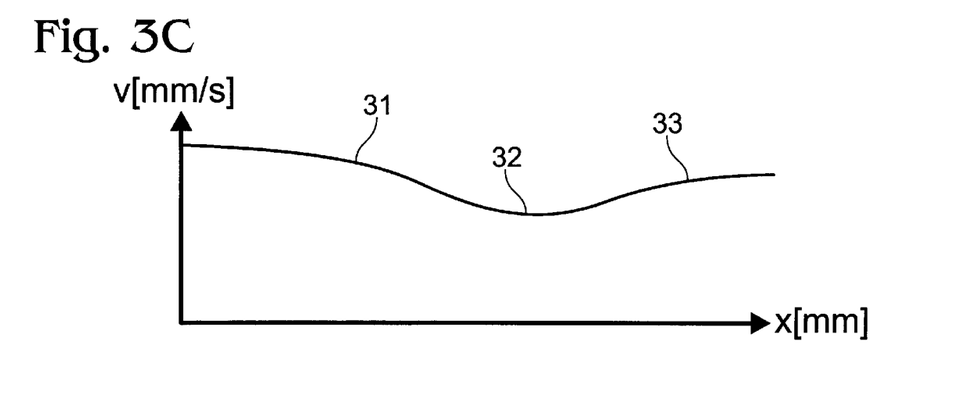
FIG. 3C is a Velocity v. Distance graph, similar to FIG. 2C, illustrating the variations in gas flow velocity v as the gas travels through the epitaxial reaction chamber incorporating the baffle of the present invention as shown in FIGS. 3A and 3B.

Referring to FIG. 3C, a more uniform gas velocity v over the reaction chamber distance x is achieved by the present invention because of the reduction in cross-sectional area variations within the reaction chamber. However, similar to the gas flow of the prior art (see FIG. 2C), the gas flow velocity v will still decrease 31 due to the radial, horizontal increase cross-sectional area. A minimum gas flow velocity 32 is reached at the widest point of the reaction chamber, and in the rear portion 10 of the reaction chamber, the gas flow velocity v increases again 33 due to the radial, horizontal decrease in the cross-sectional area. This first embodiment, therefore, allows a smoother and better controlled gas flow 7 over the prior art, improving epitaxial layer parameters and reducing gas flow turbulence problems that result particle migration from the lower portion 8 of the reaction chamber (see FIG. 2B).

Referring to FIGS. 4A, 4B, 5A, 5B and 5C and 6A, 6B and 6C. A second and most preferred embodiment of the invention incorporates side baffles 40, preferably made of quartz, in addition to a bottom baffle 30. The side baffles 40 are placed such that side baffle bases 40b rest on a top surface 2a of the bottom panel 2 and the top surface 30a of the bottom baffle 30. The side baffles 40 are located opposite each other in the reaction chamber such that the susceptor 13 and the wafer 14 are unobscured from receiving the gas flow 7. An inner surface 40a of the side baffles 40 is substantially planar and extends vertically from the top surfaces of the bottom panel 2 and baffle 30a, respectively, to the top panel 1 FIG. 1. The side baffles therefore serve to eliminate the horizontal cross-sectional variations resulting from the increasing and decreasing width of the reaction chamber. This further reduction in cross-sectional area changes increases the homogeneity of the gas flow 7 and therefore results in an improved epitaxial layer thickness and resistivity control as compared to the prior art.

Figure 4A:
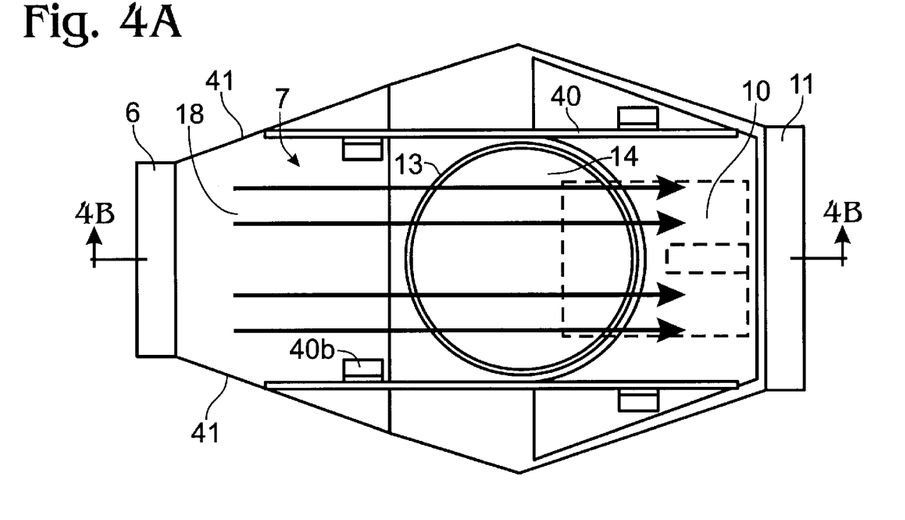
FIG. 4A is a top plan view of the epitaxial reaction chamber of FIG. 1, with the top panel removed and incorporating a second and most preferred embodiment of the present invention, namely, having the same baffle as in FIGS. 3A and 3B, and further having side baffles placed opposite each other along either side of the reaction chamber.
Figure 4B:
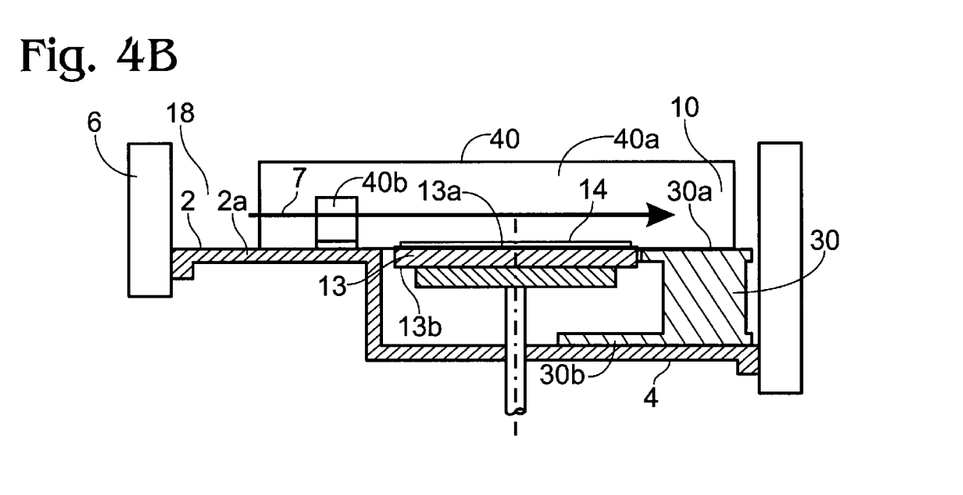
FIG. 4B is a sectional view of the epitaxial reaction chamber and quartz baffles of the second preferred embodiment, taken along line 4B—4B in FIG. 4A, and schematically showing the substantially uniform gas flow.
Figure 4C:
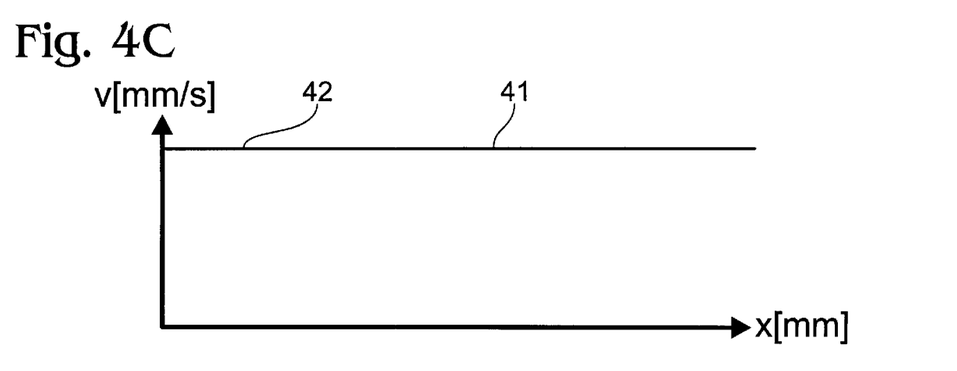
FIG. 4C is a Velocity v. Distance graph showing the substantially uniform gas flow velocity v through the epitaxial reaction chamber incorporating the second preferred embodiment of the present invention, as shown in FIGS. 4A and 4B.
Figure 5A:
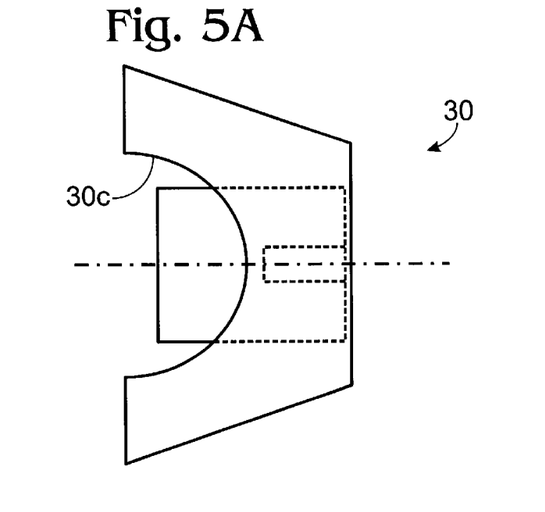
FIGS. 5A, 5B and 5C includes a top plan, front elevation and left side view of the baffle placed on the lower bottom panel in the first and second preferred embodiments as shown in FIGS. 3A, 3B, 4A, and 4B.
Figure 5B:
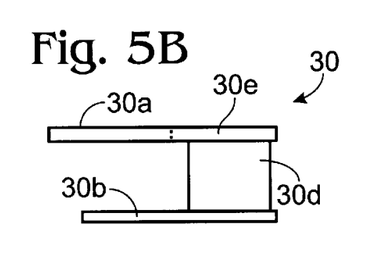
Figure 5C:
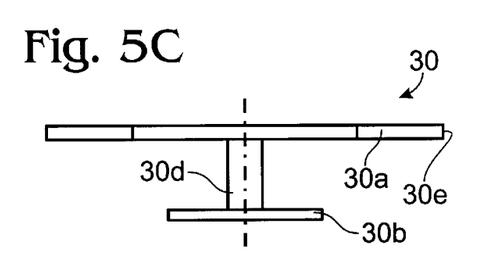
Figure 6A:
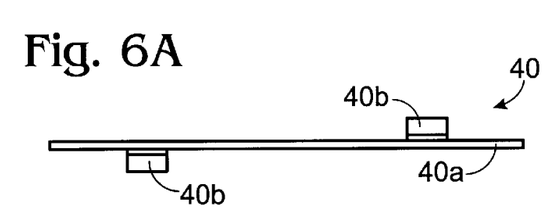
FIGS. 6A, 6B and 6C includes a top plan, front elevation and left side view of one of the side baffles of the second preferred embodiment, as shown in FIGS. 4A and 4B.
Figure 6B:
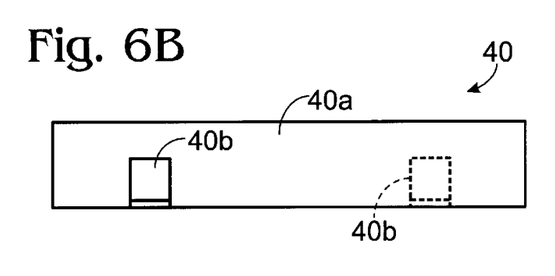
Figure 6C:
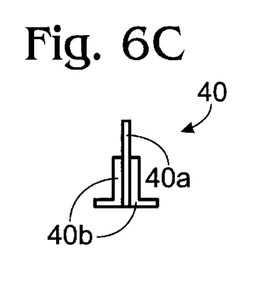

Referring to FIG. 4C, the gas flow velocity v over the distance x of the reaction chamber is substantially uniform 41. However, when entering through the gas injector 6, the gas may still encounter an initial increase of the chamber cross-sectional area before reaching the side baffles 40 (see FIG. 4A), which will cause a slight drop 42 in the gas flow velocity v before it stabilizes over the susceptor 13 and wafer 14. Gas flow disturbances, if any, such as velocity fluctuations or turbulances, resulting from the introduction of the side baffles 40 can be reduced by tapering the ends of and/or extending the side baffles 40.

For the purposes of this invention, it should be noted that any baffle design which reduces or prevents gas flow turbulence by means of providing a more constant cross-sectional area for such gas flow within the reaction chamber will suffice. Possible applications of this invention include use in any epitaxial reactor system employing a single or multiple wafer reaction chamber, where the gas flow within the individual reaction chamber or chambers is influenced by structural cross-sectional area deviations of said reaction chambers, and where such gas flow deviations cause gas turbulence that will affect the homogeneity of the epitaxial layer thickness and resistivity, and where such gas turbulence may disturb particles settled on the lower bottom panel, and where such particles may migrate to the surface of semiconductor wafers during processing.

The terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims set forth. Therefore, having described and illustrated the principles of the invention in a first and second preferred embodiments thereof, it should be apparent that the invention can be modified in arrangement and detail without departing from such principles. I therefore claim all modifications and variations coming within the spirit and scope of the following claims.

I claim:

1. A deposition system for chemical vapor deposition on a substrate, the deposition system comprising:
    a reaction chamber having a gas injector, a gas outlet, a right sidewall, and a left sidewall, the reaction chamber further having a non-uniform cross-sectional area;
    a first portion of the reaction chamber having a larger cross-sectional area than other portions of the reaction chamber; and
    a baffle located within the first portion of the reaction chamber for reducing the cross-sectional area of the first portion, thereby creating a more uniform cross-sectional area of the reaction chamber and improving a gas flow through the reaction chamber from the gas injector to the gas outlet to improve epitaxial layer thickness control and deposition quality.

2. The deposition system according to claim 1, wherein the deposition system further comprises a side baffle placed along a sidewall of the reaction chamber and having a substantially planar inside surface for further reducing variations in cross-sectional area and thereby reducing gas flow disturbances and velocity variations.

3. A chemical vapor deposition system for improved epitaxial layer thickness control and reduction of light point defects of a substrate formed by gaseous deposition of silicon onto a substrate from a gas flow over the substrate, the chemical vapor deposition system comprising:
    a reaction chamber having a top panel, a front, a front portion, a rear, a rear portion, a bottom panel located in the front portion, a lower bottom panel located in the rear portion, a right sidewall, and a left sidewall, the reaction chamber further having a larger cross-sectional area in the rear portion than in the front portion due to the lower bottom panel being displaced a specified distance from the bottom panel away from the top panel;
    a susceptor mounted within the reaction chamber for removably supporting the substrate at approximately the level of a top surface of the bottom panel; and
    a baffle located within the rear portion of the reaction chamber having a base in contact with the lower bottom panel, and a top surface at approximately the level of the top surface of the bottom panel, the top surface of the baffle being substantially planar and configured to substantially fill a horizontal area between the left and right sidewall and between the rear of the reaction chamber and around a back portion of the susceptor.

4. The chemical vapor deposition system according to claim 3, in which the reaction chamber has a horizontally varying cross-sectional area from the front of the reaction chamber toward the back of the reaction chamber;
    the system further comprising:
    a pair of side baffles located within the reaction chamber, each having a substantially planar inside surface filling approximately a vertical area between the top panel and the top surface of the bottom panel and between two specified points along the respective right or left sidewall for further reducing variations in cross-sectional area to reduce gas flow turbulence and velocity variations; and
    the side baffles located opposite each other across the substrate such that they do not obstruct the gas flow over the substrate.

5. A method for reducing gas flow turbulence and gas flow velocity fluctuations of a gas being used for chemical vapor deposition onto a substrate within a reaction chamber, the reaction chamber having a non-uniform cross-section, a bottom panel, a right and a left sidewall, a first portion and other portions, the first portion having a larger cross-sectional area than the other portions, the method comprising:
    placing a quartz baffle within the first portion of the reaction chamber to create a more uniform cross-sectional area for the gas flow passing through the reaction chamber; and
    orienting the quartz baffle such that a top surface thereof is located at approximately the level of a top surface of the bottom panel, the top surface of the quartz baffle being substantially planar and configured to substantially fill a horizontal area between the left and right sidewall and between the rear of the reaction chamber and around the susceptor up to approximately the middle of the susceptor.

6. The method according to claim 5, further comprising the step of:
    placing a pair of side baffles within the reaction chamber, each side baffle having a substantially planar inside surface which substantially fills a vertical area between the top panel and the top surface of the bottom panel and between two specified points along the respective right or left sidewall for further reducing variations in cross-sectional area to reduce gas flow turbulence and velocity variations; and
    orienting the side baffles opposite each other across the substrate such that they do not obstruct the gas flow over the substrate, thereby creating a more uniform cross-sectional area for the gas flow through the reaction chamber.

7. A baffle for use in a reaction chamber of a chemical vapor deposition system, the baffle comprising:
    a top surface substantially filling a horizontal area of the reaction chamber within a rear portion thereof and around a back portion of a susceptor for reducing turbulence of a gas flow and increasing the quality of deposition onto a substrate.

8. A side baffle for use within a reaction chamber of a chemical vapor deposition system, the side baffle comprising:

a substantially planar inner surface substantially filling a vertical cross-sectional area of the reaction chamber from a top of the reaction chamber to a bottom of the reaction chamber and between a pair of specified points along a sidewall of the reaction chamber without obstructing the substrate from the gas flow for improving the quality of a deposition onto a substrate.

9. An epitaxial chemical vapor deposition system for deposition of silicon onto a substrate from a gas flow flowing over the substrate, the epitaxial chemical vapor deposition system comprising:

a reaction chamber having a top panel, a bottom panel, a right sidewall, a left sidewall, a lower bottom panel, and a gas outlet;

a susceptor located within the reaction chamber for removably supporting the substrate;

a first baffle located within the reaction chamber having a top surface extending substantially from the gas outlet to around a back portion of the susceptor and from the right sidewall to the left sidewall at the level of a top surface of the bottom panel; and a pair of side baffles, each having a substantially planar inside surface, located opposite from each other across the susceptor and extending along the right sidewall and the left sidewall, respectively, the substantially planar inside surfaces of the side baffles substantially filling a vertical cross-sectional area between the top surface of the bottom panel and the top panel and between two specified points along a respective sidewall, the side baffles not obstructing the substrate from receiving the gas flow.

* * * * *